United States Patent [19]

Bryan et al.

[11] 4,403,827
[45] Sep. 13, 1983

[54] PROCESS FOR PRODUCING A DIFFRACTION GRATING

[75] Inventors: David A. Bryan, St. Charles; John K. Powers, St. Louis County, both of Mo.

[73] Assignee: McDonnell Douglas Corporation, St. Louis, Mo.

[21] Appl. No.: 186,584

[22] Filed: Sep. 12, 1980

[51] Int. Cl.³ .............................................. G02B 5/18
[52] U.S. Cl. .............................. 350/162.17; 350/320
[58] Field of Search ............. 350/162 R, 320, 162.17, 350/162.2, 162.23, 320; 430/1, 2, 510, 512

[56] References Cited

U.S. PATENT DOCUMENTS 2,927,023 3/1960 Martin ................................. 430/510

OTHER PUBLICATIONS

Lehmann, Matt, "Fabrication of Metallic Gratings on Photoresist by Holographic Recording", Conference & Proceedings of the Engineering Applications of Holography Symposium, Los Angeles, Calif., Feb. 16–17 1972, pp. 327–330.

*Primary Examiner*—Bruce Y. Arnold
*Attorney, Agent, or Firm*—Gravely, Lieder & Woodruff

[57] ABSTRACT

A diffraction grating is formed by depositing a glass film on a substrate and thereafter applying to the glass film a layer that is highly absorptive to radiation of a specific wavelength. The highly absorptive layer is then coated with a photoresist that is transparent and photosensitive to light of the specific wavelength. Next the photoresist layer is exposed with a holographic image of a desired grating pattern, and the exposed areas are carried away in a developing solution, leaving the photoresist with a grating pattern consisting of a series of closely spaced ridges separated by voids. During the exposure of the photoresist, the absorbing layer absorbs most of the radiation that penetrates the photoresist and thereby prevents that radiation from reflecting from the glass layer or the substrate and creating a pronounced standing wave pattern. A wave pattern of that nature would expose the photoresist in undesired areas, resulting in weakened ridges during the subsequent development. By reducing the standing waves, unusually high ridges are obtained. Thereafter, the deep grating pattern is transferred to the glass film by ion-milling the exposed surface of the photoresist. This erodes both the photoresist and the glass film, and due to the deep grating pattern in the photoresist, the grooves imparted to the glass film are also quite deep. The greater depth of the grooves in the glass significantly improves the diffraction efficiency.

17 Claims, 8 Drawing Figures

PROCESS FOR PRODUCING A DIFFRACTION GRATING

BACKGROUND OF THE INVENTION

This invention relates in general to a diffraction grating and more particularly to a process for producing such a grating.

Electromagnetic radiation at any wavelength in the visible and near visible region of the spectrum has a tremendous capacity for transmitting information because of the extremely high frequency of the radiation. This capacity can be increased still further by multiplexing. For example, several beams of light, each of a different wavelength and modulated such that it alone is transmitting a large amount of information, may be combined at a multiplexing device and transmitted as a single beam. Various transmission mediums are available, with single mode optical fiber perhaps being the most useful for high data rates. Of course, to extract the information, the individual beams that form the multiplexed beam must be separated, and this requires a demultiplexer. A diffraction grating is suitable for this purpose, provided the spacing between the grooves of the grating varies. This causes the different wavelengths of the light beam to diffract at different locations along the grating. Thus, each of the beams can be monitored at its own location along the grating.

Holographic procedures are currently used to produce diffraction gratings on glass and other substances as well. Normally a thin layer of glass is deposited on a substrate, and then a layer of photosensitive material, called photoresist, is applied to the surface of the glass. Next, interfering coherent beams of monochromatic light are projected onto the photoresist to produce the image of a grating pattern. This exposes the photoresist which is subsequently developed to dissolve and wash away the exposed areas, leaving the photoresist with a series of alternate ridges and grooves. The grooves are, in effect, transferred to the glass layer by ion-milling which erodes both the photoresist and the glass.

The efficiency of any diffraction grating as a means for separating light of different wavelengths depends to a large measure on the depth of the grooves in the grating. Present optical irradiation procedures do not produce very deep or consistent grooves because the photoresist is not exposed uniformly. In particular, the incident light exposes the photoresist on its surface and generally uniformly throughout its depth because the photoresist is transparent. However, the incident light then reflects from the glass waveguide, as well as from the substrate, and these reflections create standing wave patterns in the photoresist. This secondary exposure destroys the uniformity of the initial exposure produced by the incident light. The distortion is such that upon subsequent development of the photoresist, the closely spaced ridges that remain are deeply undercut (FIG. 6). Indeed, the ridges are so weakened by the undercuts that they cannot withstand the development, and as a consequence they break off and wash away close to the glass film. This in turn limits the depth of the grooves that are produced during the subsequent ion-milling.

Photoresists which are less transparent to the interfering rays would of course greatly reduce the intensity of the standing waves, but these photoresists are formed from inorganic materials and are not as easily processed as organic photoresists, nor are they exposed in a uniform manner throughout their depth by the incident light.

SUMMARY OF THE INVENTION

One of the principal objects of the present invention is to provide a process for imparting a diffraction grating to a transparent waveguide with the grooves of the grating being deep enough to render the grating highly efficient. Another object is to provide a process of the type stated which is useful and effective with organic photoresists. A further object is to provide a process of the type stated which is easily and inexpensively practiced. An additional object is to provide a process of the type stated which produces a very consistent and uniform grating pattern. Still another object is to provide a diffraction grating that is ideally suited for demultiplexing signals transmitted in the visible or near visible regions of the spectrum. These and other objects and advantages will become apparent hereinafter.

The present invention resides in a process that includes applying an absorbing layer to a substance on which a grating pattern is desired, with the absorbing layer being highly absorptive to radiation at a specific wavelength. It further includes applying a photoresist layer to the absorbing layer and directing radiation of the specific wavelength at the photoresist layer to expose it in a series of closely spaced lines corresponding to the desired grating pattern. In addition, the process includes developing the exposed photoresist layer such that portions are removed to produce alternate ridges and grooves, and then removing the underlying substance at the grooves so as to transfer the grooves into that substance. The invention also consists in the parts and in the arrangements and combinations of parts hereinafter described and claimed.

DESCRIPTION OF THE DRAWINGS

In the accompanying drawings which form part of the specification and wherein like numerals and letters refer to like parts wherever they occur.

DETAILED DESCRIPTION

Figure 1:
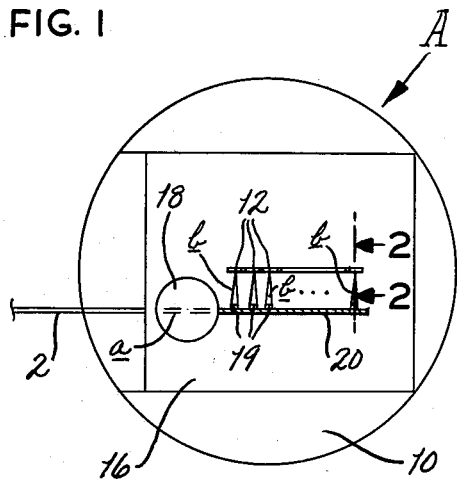
FIG. 1 is a plan view of an optical demultiplexer that includes the diffraction grating produced in accordance with the present invention.

Referring now to the drawings, A (FIG. 1) designates an optical demultiplexer that is useful in separating polychromatic incident light into its various components, that is wavelengths. As such, the demultiplexer A may be employed to break a multiplexed beam a of light down into beams b of monochromatic light from which it is formed. Each monochromatic beam b when modulated has the capacity for carrying a large amount of information and, by multiplexing, this capacity is increased several fold. The multiplexed beam a may be transmitted to the demultiplexer A through a single mode optical fiber 2 which is coupled to the demultiplexer A.

Figure 2:
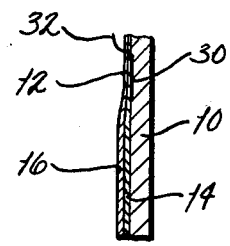
FIG. 2 is a fragmentary sectional view of the optical demultiplexer taken along line 2—2 of FIG. 1.

The demultiplexer A includes a substrate 10 (FIGS. 1 and 2) that is preferably formed from a semiconductor material such as silicon or gallium arsenide and has a plurality of photodetectors 12 integrated into it, with the detectors 12 being arranged generally in a line and spaced somewhat apart. Actually, it is desirable to have the detectors 12 arranged in groups with each group being positioned to receive diffracted light of a different wavelength, that is one of the beams b into which the multiplexed incident beam a is divided. This provides a high degree of redundancy. The detectors 12 are actually P-type dopants diffused into very shallow pockets 30 (FIG. 2) formed in the N-type substrate 10.

Figure 4:
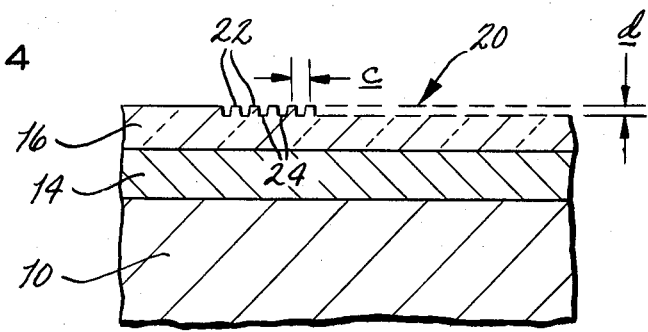
FIG. 4 is a sectional view of the diffraction grating taken along line 4—4 of FIG. 3.

The substrate 10 and the photodetectors 12 which are integrated into it are covered with a buffer layer 14 (FIGS. 2 and 4) which is tapered to about 200 nm in the vicinity of the photodetectors 12 so as to pass light through it to the photodetectors 12. Where the substrate is silicon, the buffer layer 14 may be silicon dioxide having a thickness of about 1.3 $\mu$m. Other substances are suitable for the buffer layer 14 as long as they are chemically and physically compatible with the material of the substrate 10 and are further essentially transparent to each of several wavelengths into which the incident light is divided. The buffer layer 14 must also have a suitable index of refraction.

Bonded firmly to the buffer layer 14 is a waveguide 16 (FIGS. 2 and 4) which is formed from glass. Actually the waveguide 16 is a glass film having a thickness of about 0.94 $\mu$m, and that glass should have a higher index of refraction than the buffer layer 14. Of course, the waveguide 16 should be transparent to the incident light including all of the wavelengths that compose it. Corning 7059 glass is ideally suited for use in the waveguide 16, the index of refraction for that glass being 1.56, whereas the index of refraction for the silicon dioxide buffer layer 14 is 1.47.

The optical fiber 2 is coupled to the side edge of the waveguide 16, and immediately beyond the point of attachment is a thin film collimating lens 18 (FIG. 1) which directs the polychromatic beam a in a straight line which is parallel to the row of photodiodes 12, but offset to the side of them. The lens 18 may be a circularly symmetric tapered deposit of tantalum pentoxide ($Ta_2O_5$) which projects from the surface of the waveguide 16. Similarly, ahead of each group of photodetectors 12 is a condensing lens 19 which is likewise formed from a deposit of tantalum pentoxide on the waveguide 16.

Figure 3:
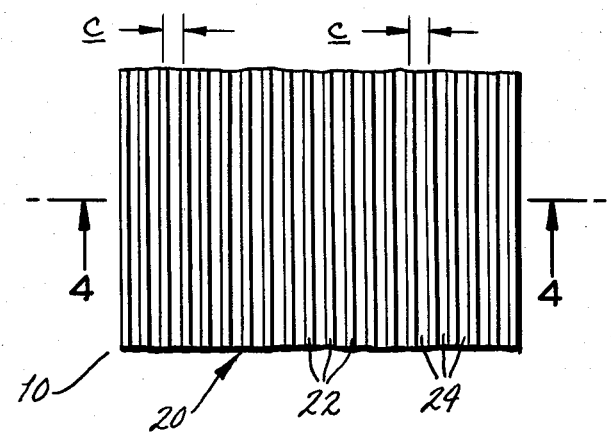
FIG. 3 is an enlarged plan view of the diffraction grating.
Figure 5:
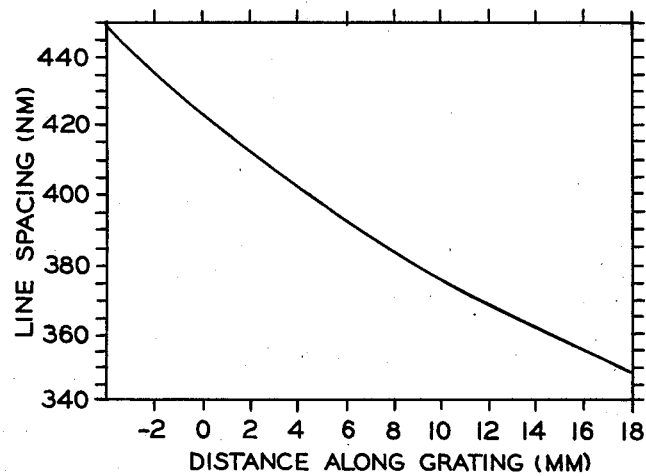
FIG. 5 is a graph showing the variances in the spacing between adjacent peaks or valleys along the diffraction grating.

On its outwardly presented surface, the waveguide 16 possesses a diffraction grating 20 (FIG. 1) which consists of closely spaced alternate peaks 22 and valleys 24 (FIGS. 3 and 4) that are parallel and oriented at 45° with respect to the optical axis of the coolimating lens 18 so that the polychromatic beam a from the optical fiber 2 will pass through the waveguide 16 at 45° to the peaks 22 and valleys 24 of the diffraction grating 20. Measured along the optical axis, the grating 20 extends about 18 mm. The grating depth d (FIG. 4), which is the difference in elevation between the peaks 22 and the valleys 24, is at least 30 nm and is preferably greater than 40 nm. The grating period, which is the spacing c between adjacent peaks 22 or adjacent valleys 24 along the pattern 20, is not constant, but instead varies in a generally linear manner between 360 nm and 420 nm, with the smallest spacing being along that portion of the grating 20 that is closest to the collimating lens 19 (FIG. 5).

The optical fiber 2 is coupled to the side edge of the waveguide 16 such that light emitted from its end is directed to the collimating lens 18, where it is collected and projected as a thin beam a toward the area of the diffraction grating 20. Moreover, the beam a is oriented at 45° to the general direction of the peaks 22 and the valleys 24.

Upon encountering the diffraction grating 20, the beam a is diffracted and the location along the grating 20 at which the diffraction occurs depends on the wavelength of the light within the beam a. Indeed, the shorter wavelengths diffract first, since the spacing between the peaks 22 and valleys 24 is smallest in the region where the beam a first encounters the grating 20. Each wavelength which is thereafter diffracted is progressively longer. The diffraction components are separated from each other within the waveguide 16 to form separate monochromatic beams b within the waveguide 16, and each monochromatic beam b is directed toward a different condensing lens 19 and the group of photodetectors 12 that lies beyond that lens. The detectors 12 of any group monitor the beam b that is directed toward the group, converting the beam b into an electrical signal having the characteristics of the beam b itself.

Due to the unusually high grating depth d and the uniformity of the ridges or peaks 22, the diffraction efficiency is quite high, ranging between 70% and 90%. This is to be compared with a diffraction efficiency of only about 1% when the grating depth is 10 nm, even with uniform ridges or peaks 22, which in themselves have been hard to achieve with current procedures.

To produce the optical demultiplexer A, a flat semiconductor material having a thickness of about 0.625 mm is cut to the desired size and shape to provide the substrate 10. Silicon is an excellent material for the substrate 10 although other materials such as gallium arsenide, lithium niobate, and graded-index glass are also suitable.

By means of a photolithographic procedure, a series of pockets 30 (FIG. 2) are formed in the substrate 10, and the pockets 30 are arranged in arrays which correspond in position to the desired location of the photodetectors 12. Substances are then introduced into the pockets 30 to, in effect, dope the silicon substrate 10 at the pockets 30. This produces the photodetectors 12, each of which has a metallized pad 32 for conducting an electrical signal.

Figure 7:
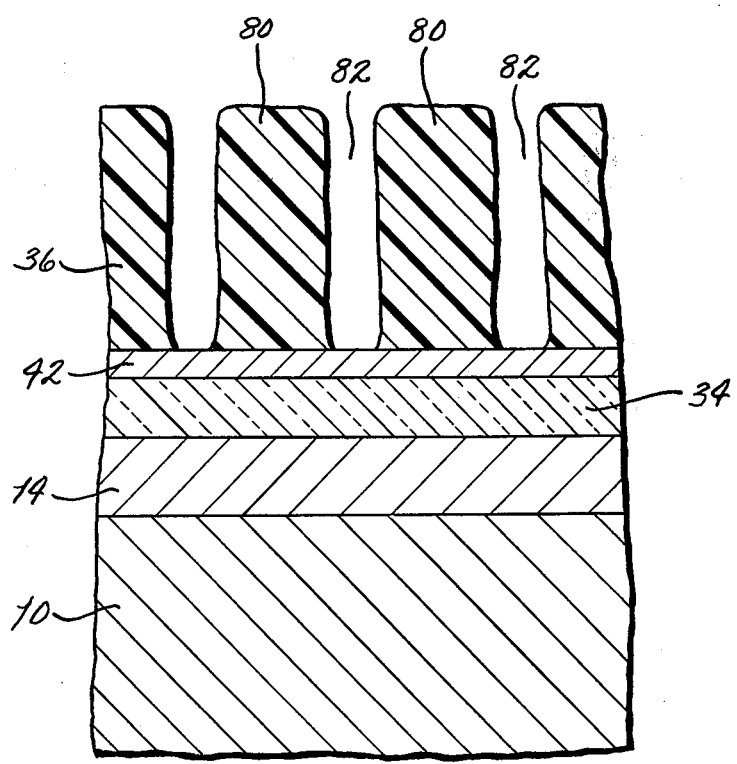
FIG. 7 is an enlarged sectional view of an exposed and developed photoresist used to form the diffraction grating according to the present invention.

Next, the buffer layer 14 is formed over the substrate 10 (FIG. 7), and this layer should be a material having an index of refraction that is less than the index of refraction for the waveguide 16. Where the substrate 10 is silicon, a buffer layer 14 of silicon dioxide may be produced by heating the substrate to about 1100° C. in an oxygen-rich atmosphere. The buffer layer 14 covers not only the planar surface of the substrate 10, but the photodetectors 12 as well. The oxidation of the silicon should be sufficient to provide the buffer layer 14, which is so formed, with a thickness of about 1.3 $\mu$m.

Once the buffer layer 14 is completed, the waveguide 16 with its diffraction grating 20 is produced over it. This in itself involves several steps.

First, a suitable glass film 34 (FIG. 7) is deposited on the buffer layer 14, preferably by RF sputter deposition. The glass should have an index of refraction which is greater than the index of refraction for both the buffer layer 14 and the substance which will eventually form the other boundary of the waveguide 16, and that substance will normally be air. In the case of the silicon substrate 10 and the silicon dioxide buffer layer 14, Corning 7059 glass, which has an index of refraction of 1.56, is ideally suited for the glss film 34 of the waveguide 16. The film 34 should have a thickness of approximately 0.94 μm.

Heretofore, it has been the practice to apply an organic photoresist layer 36 (FIG. 6) directly over the glass film 34 and then expose the photoresist layer 36 with a monochromatic light projected onto the photoresist layer 36 as a grid pattern, this pattern being achieved by holographic projection techniques as will subsequently be explained. Since the photoresist layer 36 is sensitive to the light at the particular wavelength and further transparent to that light, its chemistry is changed throughout its entire depth in the exposed regions, and those regions are ideally in the areas overlying the locations at which the valleys 24 are to open out of the glass film 34. Under the conventional procedure, the photoresist layer 36 is then developed to dissolve and wash away the exposed areas of the photoresist layer 36. This leaves the glass film 34 with a series of closely spaced ridges 38 formed from the unexposed photoresist material. In this manner the underlying glass film 34 is prepared for ion milling, which is the next step of the conventional procedure.

During ion milling, the remainder of the photoresist layer 36, that is the ridges 38, and the intervening exposed areas of the glass film 34 are bombarded with ions of a suitable gas such as argon. These ions erode both the photoresist ridges 38 and the portions of the glass film 34 which are exposed between the ridges 38. As a consequence, valleys are imparted to the glass film 34 beneath the exposed regions of the photoresist layer 36, while peaks develop at the areas formerly covered by the ridges 38 of the photoresist layer 36.

By using the foregoing conventional procedure, one can obtain only a very minimum grating depth, and this imparts a very low efficiency to the diffraction grating that is so formed. Indeed, under conventional procedures, the maximum grating depth that can be achieved is about 10 nm, and this provides a diffraction efficiency of about 1%.

The problem seems to reside in the fact that the light used to expose to photoresist layer 36 not only passes into and exposes the photoresist material 36 all the way to the glass film 34, but further reflects from the glass film 34, the buffer layer 14 and the substrate 10 with an intensity nearly equal to that of the incident light falling upon the photoresist layer 36. All of this reflected radiation sets up standing wave patterns in the photoresist layer 36 in regions that are not intended for exposure. In particular, the standing waves concentrate the radiation in regularly spaced regions through the thickness of the photoresist layer 36. As a consequence, the photoresist layer 36, upon being developed is left with ridges 38 having undercuts 40 (FIG. 6) in their side walls. In other words, the ridges 38, instead of having the desired straight or uniform side walls, have undulated side walls. The undercuts 40 weaken the ridges 38 to the extent that they cannot withstand the development procedure, and as a result, the ridges 38 break off at the first or lowermost undercut 40. This leaves ridges 38 of very limited height which will not withstand sustained ion bombardment. Thus, the ridges 38 erode rapidly under the ion bombardment and the valleys 24 imparted to the glass film 34 are indeed shallow.

To overcome the foregoing problem and thereby significantly increase the grating depth, an absorbing layer 42 (FIG. 7) that is capable of absorbing much of the radiation cast upon it in the holographic exposure, is interposed between glass film 34 and the photoresist layer 36. Where the exposure is achieved with violet or near violet radiation, iron oxide ($Fe_2O_3$) is ideally suited for use as the absorbing layer 42 because it absorbs strongly in the violet region of the spectrum. The iron oxide is applied to the glass film 34, preferably by vapor deposition, and the application should be of sufficient duration to provide the absorbing layer 42 that is so formed with a thickness of about 200 nm. A reactive deposition from oxygen and bubbled vapor of iron pentacarbonyl of 3 minutes duration of 90° C. affords a suitable iron oxide absorbing layer 42. The layer 42 may also be deposited by sputtering from an iron oxide target.

Figure 6:
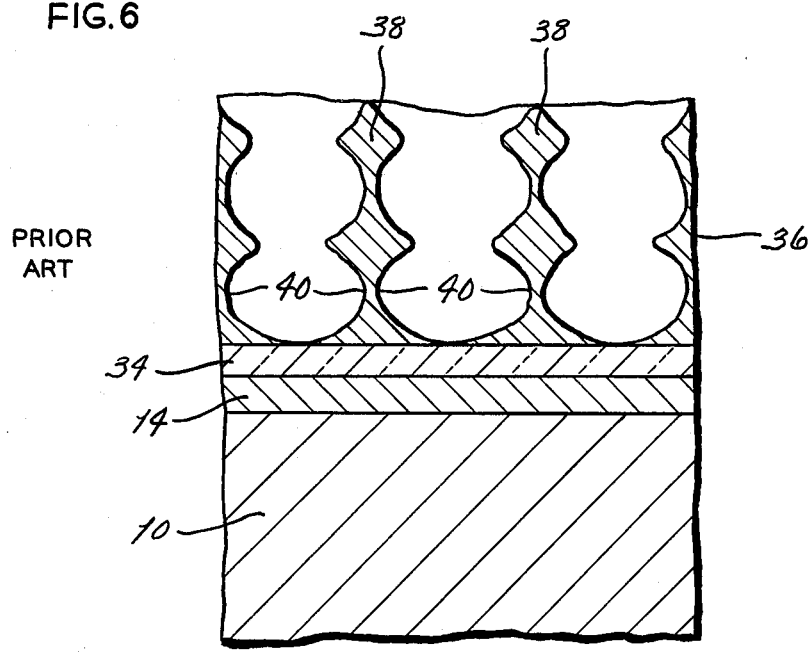
FIG. 6 is an enlarged sectional view showing an exposed and developed photoresist used to form a diffraction grating by conventional procedures.

Once the absorbing layer 42 is deposited, it is in turn coated with a photoresist layer 36 (FIG. 7) which is the same organic material used in the photoresist layer 36 of the conventional process (FIG. 6). A suitable material for the layer 36 is Shipley AZ-1350B positive photoresist which is quite sensitive to radiation in the violet region of the spectrum and is also quite transparent to that radiation as well, so that it will expose uniformly throughout its depth. This material should be applied in a quantity sufficient to provide the photoresist layer 36 with a thickness of at least 190 nm, and preferably more.

Next, the photoresist layer 36 is exposed by projecting an image of the grating pattern 20 upon it. The light that casts the image should of course contain a bandwidth to which the photoresist material of the layer 36 is sensitive, and should further not contain any bandwidths to which the absorbing layer 42 is either highly reflective or transparent. Where the photoresist layer 36 is Shipley AZ-1350B positive photoresist and the absorbing layer 42 is iron oxide, monochromic violet beams, such as emitted from a krypton laser, are ideally suited for exposing the photoresist layer 36.

Figure 8:
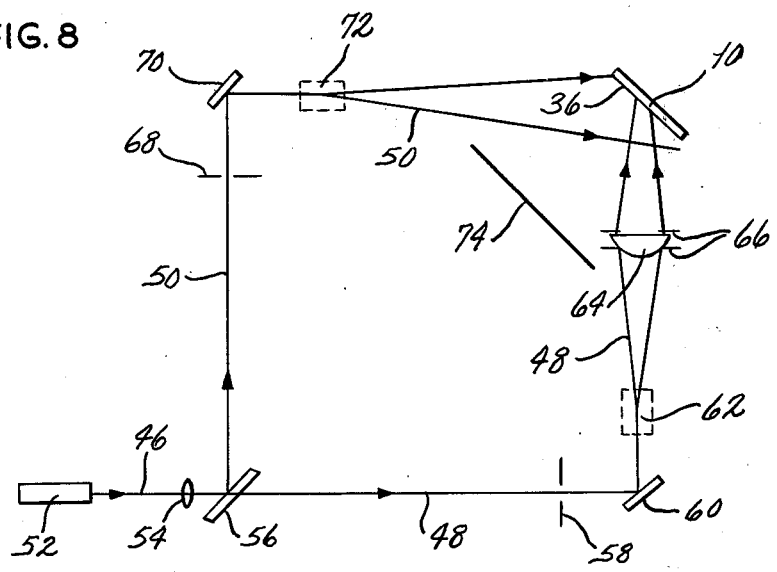
FIG. 8 is a schematic view of the optical system for exposing the photoresist.

To derive the image of the diffraction grating 20, a single monchromatic beam 46 (FIG. 8) is split into two beams 48 and 50 which are then caused to interfere at the face of the photoresist layer 36 to form a holographic image or hologram consisting of closely spaced lines. More specifically, the single violet beam 46 is derived from a laser 52 which projects the beam 46 through a lens 54 and onto a half-silvered beam splitter 56 which divides the single beam 46 into two separate beams 48 and 50, the former of which is generally coincident with the original beam 46 while the latter is at a right angle.

The coincident beam 48 passes through an adjustable iris diaphragm 58 to a mirror 60 which reflects it to a pinhole spatial filter 62 that removes shadows and causes the generally narrow beam 48 to spread. The beam 48 thereupon passes through a cylindrical lens 64 which causes it to converge slightly. The lens 64 has an antireflective coating and the peripheral portions of its forward and rear faces are obscured by masks 66, all to prevent unwanted reflections.

The other beam 50 likewise passes through an adjustable iris diaphragm 68 to a mirror 70 where it is reflected to a pinhole spatial filter 72 that spreads it and also removes shadows. The arrangement is such that the coherent beams 48 and 50 emerging respectively from the lens 64 and the spatial filter 72, interfere at the exposed face of the photoresist 36 to produce a holographic image of closely spaced alternate lines of illumination and darkness. The illuminated lines, of course, expose the photoresist layer 36. To further prevent unwanted reflections, another black mask 74 is positioned opposite and generally parallel to the photoresist layer 36, but out of the beams 48 and 50. The presence of the cylindrical lens 64 causes the spacing between illuminated lines to vary along the image that is cast.

The closely spaced thin lines of light pass through the generally transparent layer of photoresist 36, and thereby expose it uniformly throughout its depth. However, upon encountering the absorbing layer 42, practically all of the radiation is absorbed. Very little reflects from the absorbing layer 42 and still less passes through it to be reflected back from the glass film 34, buffer layer 14, and substrate 10. Consequently, the magnitude of standing waves in the photoresist layer 36 is greatly diminished, and the exposure occurs in a uniform manner throughout the depth of the photoresist layer 36.

After the photoresist layer 36 is exposed, it is developed by immersing it in a suitable solution that loosens and washes away the regions exposed by the light. The resulting structure is a series of closely spaced ridges 80 (FIG. 7) composed of unexposed photoresist material and a series of voids 82 separating the ridges 80. The ridges 80 extend substantially the full height of the original photoresist layer 36 and have straight side walls which impart uniform width to the ridges 80. The voids 82 extend downwardly to the absorbing layer 42 which is exposed at the base of each void 82.

Next the surface composed of the closely spaced ridges 80 and intervening voids 82 is subjected to a bombardment of ions, with the intensity of the bombardment being sufficient to erode both the ridges 80 remaining from the photoresist layer 36 and the absorbing layer 42 between the ridges 80, as well as the glass film 34 that underlies the absorbing layer 42. This is known as ion milling and it continues long enough to completely erode the ridges. As a result, the grating pattern of the photoresist layer 36 is transferred into the glass film 34 in the form of the peaks 22 and valleys 24. Argon-ion milling performed with a Commonwealth Scientific Millatron IV system is suitable.

Any of the photoresist layer 36 that remains after the ion milling is removed either with a chemical stripper or by ashing in an oxygen plasma. Any iron oxide that remains from the layer 42 after the ion milling is removed from the glass film 34 with a hydrochloric acid solution. This does not harm the glass film 34, the silicon dioxide buffer layer 14, or the silicon substrate 10.

Since the ridges 80 at the outset of the ion milling are the full height of the original photoresist layer 36, as opposed to being of very limited height as in the case of the conventional procedure, the ion milling can continue for a substantially longer period of time, and this results in a significantly greater grating depth d. Whereas the grating depth achieved by the conventional procedure is no more than about 10 nm, grating depths d as high as 40 to 50 nm are possible with the improved process that utilizes the absorbing layer 42. Moreover, the absence of reflections during the exposure of the photoresist layer 44 results in peaks 22 which are for all intents and purposes continuous throughout the entire width of the diffraction grating 20. This coupled with the substantial depth of the grating 20 provides a large area with very high diffraction efficiency.

Finally the lenses 18 and 19 (FIG. 1) are formed on the exposed surface of the glass film 34 outside of the area occupied by the diffraction grating 20. This may be achieved by masking the glass film 34 to cover all of it except the specific locations where the lenses 18 and 19 are desired and then sputtering a suitable lens substance such as tantalum pentoxide ($Ta_2O_5$) onto the exposed surface of the glass film 34. This completes the production of the waveguide 16.

The diffraction grating 20 which has been described is particularly adapted for use in a demultiplexer, such as the demultiplexer A. However, the process for producing the diffraction grating A may also be employed for diffraction gratings designed for a wide variety of uses.

This invention is intended to cover all changes and modifications of the example of the invention herein chosen for purposes of the disclosure which do not constitute departures from the spirit and scope of the invention.

What is claimed is:

1. A process for forming a diffraction grating, said process comprising: applying an absorbing layer to a grating substance on which a grating pattern is to be produced, the absorbing layer being highly absorptive to radiation at a specific wavelength; applying a photoresist layer over the absorbing layer so that the absorbing layer is between the grating substance and the photoresist layer, the photoresist layer being photosensitive to radiation at the specific wavelength; directing beams of interfering coherent radiation of the specific wavelength onto the photoresist layer such that the photoresist layer is exposed in a series of closely spaced lines corresponding to the desired grating pattern; developing the exposed photoresist layer such that portions thereof are removed to provide alternate ridges and grooves in the photoresist layer which generally correspond to the desired grating pattern; and removing the absorbing material and some of the grating substance at the grooves so as to create corresponding grooves in the grating substance to thereby impart the grating pattern to the grating substance.

2. The process according to claim 1 wherein the step of removing the absorbing material and some of the grating substance at the grooves comprises eroding the ridges of the photoresist layer, the absorbing material, and some of the grating substance at the grooves.

3. The process according to claim 2 wherein the ridges, the absorbing material, and some of the grating substance are eroded by ion milling.

4. The process according to claim 1 wherein the radiation at the selected wavelength is in the violet region of the spectrum and the absorbing layer is iron oxide.

5. The process according to claim 1 wherein the grating substance is a glass film.

6. The process according to claim 5 and further comprising applying the glass film to a substrate before the absorbing layer is applied to the glass film.

7. The process according to claim 1 wherein the spacing of the closely spaced lines varies.

8. The process according to claim 1 wherein the grooves are formed to a depth of at least 30 nm in the grating substance.

9. The process according to claim 1 wherein the photoresist layer is transparent to the light at the specific wavelength and is exposed generally uniformly throughout its depth.

10. The process according to claim 1 wherein that surface of the grating substance to which the absorbing layer is applied is reflective as to radiation of the specific wavelength.

11. The process according to claim 1 wherein the absorbing layer is iron oxide.

12. The process according to claim 11 wherein the iron oxide of the absorbing layer is applied to the grating substance by vapor deposition.

13. The process according to claim 11 wherein the step of removing the absorbing material and some of the grating substance at the grooves comprises eroding both the ridges of the photoresist layer and also the iron oxide absorbing layer and the grating substance at the grooves by ion milling.

14. A process for forming a grating capable of diffracting polychromatic light into the monochromatic components from which it is composed; said process comprising applying a waveguide film to a substrate, the waveguide film being transparent to radiation of a specific wavelength and at a surface thereof also being reflective as to that radiation; applying an absorbing layer composed essentially of iron oxide to the waveguide film at the reflective surface thereof, the absorbing layer being highly absorptive as to radiation at the specific wavelength; applying a photoresist layer to the absorbing layer so that the absorbing layer is interposed between the waveguide film and the photoresist layer, the photoresist layer being photosensitive to the radiation at the specific wavelength; exposing the photoresist layer to beams of interfering coherent radiation of the specific wavelength with the radiation being cast upon the photoresist layer in a grating pattern of closely spaced lines of illumination and darkness; developing the photoresist layer such that material is removed therefrom to provide closely spaced ridges and intervening grooves that together correspond in configuration to the grating pattern; and eroding the ridges of the photoresist layer the absorbing layer, and the glass film at said grooves in the photoresist layer so as to impart grooves to the glass film.

15. The process according to claim 14 wherein the glass film is eroded until the grooves formed in it are at least 30 nm deep in the glass film.

16. The process according to claim 14 wherein the absorbing layer of iron oxide is applied to the waveguide film by vapor deposition.

17. The process according to claim 16 wherein the ridges of the photoresist layer and also the absorbing layer and glass film at the grooves ae eroded by ion milling.

* * * * *